US008457697B2

(12) United States Patent
Johansson et al.

(10) Patent No.: US 8,457,697 B2
(45) Date of Patent: Jun. 4, 2013

(54) ANTENNA SWITCHING ARRANGEMENT

(75) Inventors: Martin Johansson, Mölndal (SE); Patrik Persson, Gråbo (SE); Jonas Fridén, Mölndal (SE); Sven Anders Gösta Derneryd, Göteborg (SE); Anders Stjernman, Lindome (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 409 days.

(21) Appl. No.: 12/742,898

(22) PCT Filed: Nov. 14, 2007

(86) PCT No.: PCT/SE2007/050845

§ 371 (c)(1), (2), (4) Date: May 13, 2010

(87) PCT Pub. No.: WO2009/064229

PCT Pub. Date: May 22, 2009

(65) Prior Publication Data

US 2010/0328184 A1 Dec. 30, 2010

(51) Int. Cl.

| | |
|---|---|
| ***H04M 1/00*** | (2006.01) |
| ***H04B 1/034*** | (2006.01) |
| ***H04B 1/04*** | (2006.01) |
| ***H04B 1/18*** | (2006.01) |
| ***H03C 1/52*** | (2006.01) |
| ***H01Q 11/12*** | (2006.01) |
| ***H01Q 1/24*** | (2006.01) |
| ***H01Q 21/12*** | (2006.01) |
| ***H01Q 1/50*** | (2006.01) |
| ***H01Q 21/00*** | (2006.01) |

(52) U.S. Cl.

USPC ..... 455/575.7; 455/107; 455/121; 455/193.1; 455/575.3; 455/575.5; 455/101; 455/550.1; 455/562.1; 343/702; 343/814; 343/860; 343/861

(58) Field of Classification Search

USPC ................ 455/575.7, 550.1, 575.3, 107, 121, 455/193.1, 575.5, 101, 562.1; 343/702, 814, 343/893, 860, 861

See application file for complete search history.

(56) References Cited

U.S. PATENT DOCUMENTS 5,335,368 A * 8/1994 Tamura ...................... 455/575.7
5,852,421 A * 12/1998 Maldonado ................... 343/702
5,991,643 A 11/1999 Chao-Chen
2003/0062971 A1 4/2003 Toncich
2005/0143151 A1* 6/2005 Ito et al. ..................... 455/575.3
2007/0222697 A1 9/2007 Caimi et al.

FOREIGN PATENT DOCUMENTS

JP 2001-217624 A 8/2001
JP 2007-043410 A 2/2007

* cited by examiner

*Primary Examiner* — Jinsong Hu
*Assistant Examiner* — Opiribo Georgewill

(57) ABSTRACT

An antenna arrangement comprising an input/output connection and a first and a second tuning network with different transfer functions. The arrangement additionally comprises an antenna and a switch for connecting the input/output connection of the arrangement to one of said tuning networks, with a second switch for connecting the antenna of the arrangement to the tuning network to which the input/output connection of the arrangement has been connected. The arrangement comprises a sensor for sensing a form factor of the arrangement or of an apparatus in which the arrangement is used, and said sensor can be used for influencing said first and second switches, so that a device which has been connected to the arrangement may be connected to the antenna via a tuning network optimal for the current form factor of the arrangement.

13 Claims, 6 Drawing Sheets

ANTENNA SWITCHING ARRANGEMENT

TECHNICAL FIELD

The present invention discloses an antenna arrangement for the transmission and/or reception of electromagnetic signals. The arrangement comprises input/output means, and at least a first and a second tuning network with different transfer functions. The arrangement also comprises a first antenna and a first switch for connecting the input/output means of the device to one of the tuning networks. The arrangement also has a second switch for connecting the antenna of the arrangement to the tuning network to which the input/output means of the device have been connected.

BACKGROUND

The performance of an antenna used for the reception and/or transmission of electromagnetic signals is influenced by, inter alia, the immediate environment surrounding the antenna, due to electromagnetic interaction between the antenna and objects proximate to the antenna. The antenna-object interaction can manifest itself in undesirable ways, for example in the form of high return loss, decreased radiation efficiency, and radiation pattern perturbations. By designing the antenna arrangement in a proper way, taking into account the influence of the surrounding environment, it is possible to tune the performance of the antenna for the specific environment in which the antenna is used.

Antennas which are used in devices or terminals such as, for example, cell phones or portable computers, are however, exposed to a changing environment, such as, for example, the configuration of a "clam shell" cellular phone, or the body/lid configuration in the case of a portable "notebook" computer. In such changing environments, an antenna cannot be tuned once and for all for optimal performance. Instead, there is a need for solutions which can adaptively tune the antenna's performance depending on the situation, since there is no single tuning that maximizes the antenna's, and the corresponding communications system's performance for all possible environments.

A solution which may adapt an antenna or an antenna arrangement to a number of environment scenarios can offer good antenna performance for terminals used for mobile communications, due to the nature of usage of such devices. In particular, notebook ("laptop") computers are typically used in one of only three basic ways:

- lid open, i.e., notebook display visible and keyboard available;
- lid closed, i.e., notebook display not visible;
- lid closed (or non-existent), and display facing away from the computer chassis, such as in a computer using a "touch screen user interface".

The second of these is typical of the stationary scenario, when a computer is connected to a "docking station" or "port replicator", whereas the first and third are typical of an "unconnected scenario". When the main influence on the antenna performance is the laptop computer configuration, i.e., the lid position in relation to the computer chassis, as is almost always the case, an adaptive solution to a variable environment can be limited to handle a finite set of scenarios, in this case two. This allows for a low-complexity, low-cost solution, for example implemented as configuration-based signal routing using switched networks.

A communications system in which an antenna or antenna arrangement is installed will only achieve the desired performance level if the antenna performance, for example in terms of efficiency, pattern correlation (in the case of multiple antennas and for a given propagation channel), or directionality (radiation pattern spatial selectivity), is maintained. Since the antenna performance will be highly affected by the installation scenario, it is crucial to account for the properties of the platform (notebook, PDA, handset, etc.) when choosing the antenna solution. Some platforms, such as notebook computers with lids and clamshell phones, have inherently variable form factors, i.e. physical shapes, which makes choosing an antenna solution difficult. Different modes of operation (for example 'lid open' or 'lid closed') may require significantly different antenna solutions in order to provide good antenna performance.

Most existing antenna designs for portable devices ignore the problem of a variable form factor in the portable device. One and the same antenna(s) is/are used, regardless of the current configuration of the device in which the antenna(s) is/are installed, in addition to which the antennas are designed for a certain mode of operation, or are designed to provide an average performance quality which allows the device in which the antenna is installed to operate with an acceptable degree of performance for all form factors of the device. Thus, the antenna performance, and hence the corresponding communications system's performance, will never be ideal for all scenarios.

There are known solutions which do account for different form factors, and which are based on tuning the antenna performance based on some sort of quality measurement. One example of such a solution is shown in US patent application 2004/0027300 A1, Young-Eil Kim et al.

The solution disclosed in US 2004/0027300 A1 teaches the use of a switch installed in a laptop computer, by means of which it is possible to sense if the lid of the laptop is open or closed, and to switch between different antennas based on this.

It would be desirable to improve the solution shown in US 2004/0027300 A1, so that an increased tuneability and thereby improved antenna and communications system performance can be obtained.

SUMMARY

Thus, as stated above, there is a need for a solution by means of which an increased tuneability in an antenna arrangement can be obtained, so that the antenna arrangement may be adapted to changing form factors of a device in which it is used, or in the antenna arrangement as such.

This need is addressed by the present invention in that it discloses an antenna arrangement for the transmission and/or reception of electromagnetic signals. The arrangement of the invention comprises first input/output connection and at least a first and a second tuning network, which have different transfer functions.

Each of the tuning networks of the arrangement also comprise a first and a second input/output port, and the arrangement additionally comprises a first antenna and a first switch for connecting the first input/output connection of the arrangement to the first input/output port of one of said tuning networks. There is also a second switch for connecting the antenna of the arrangement to the second input/output port of the tuning network to which the input/output connection of the arrangement has been connected.

The inventive arrangement comprises a sensor for sensing a form factor of the arrangement or of an apparatus in which the arrangement is used, and this sensor can be used for influencing the first and second switches of the arrangement, so that a device which has been connected to the arrangement may be connected to the antenna of the arrangement via a tuning network which is optimal for the current form factor of the arrangement or of an apparatus in which the arrangement is used.

Thus, by means of the present invention, increased tuneability of an antenna arrangement based on form factor is obtained.

The invention also discloses a method for use in an antenna arrangement.

BRIEF DESCRIPTION OF THE DRAWINGS

The invention will be described in more detail in the following, with reference to the appended drawings, in which.

DETAILED DESCRIPTION

Figure 1:
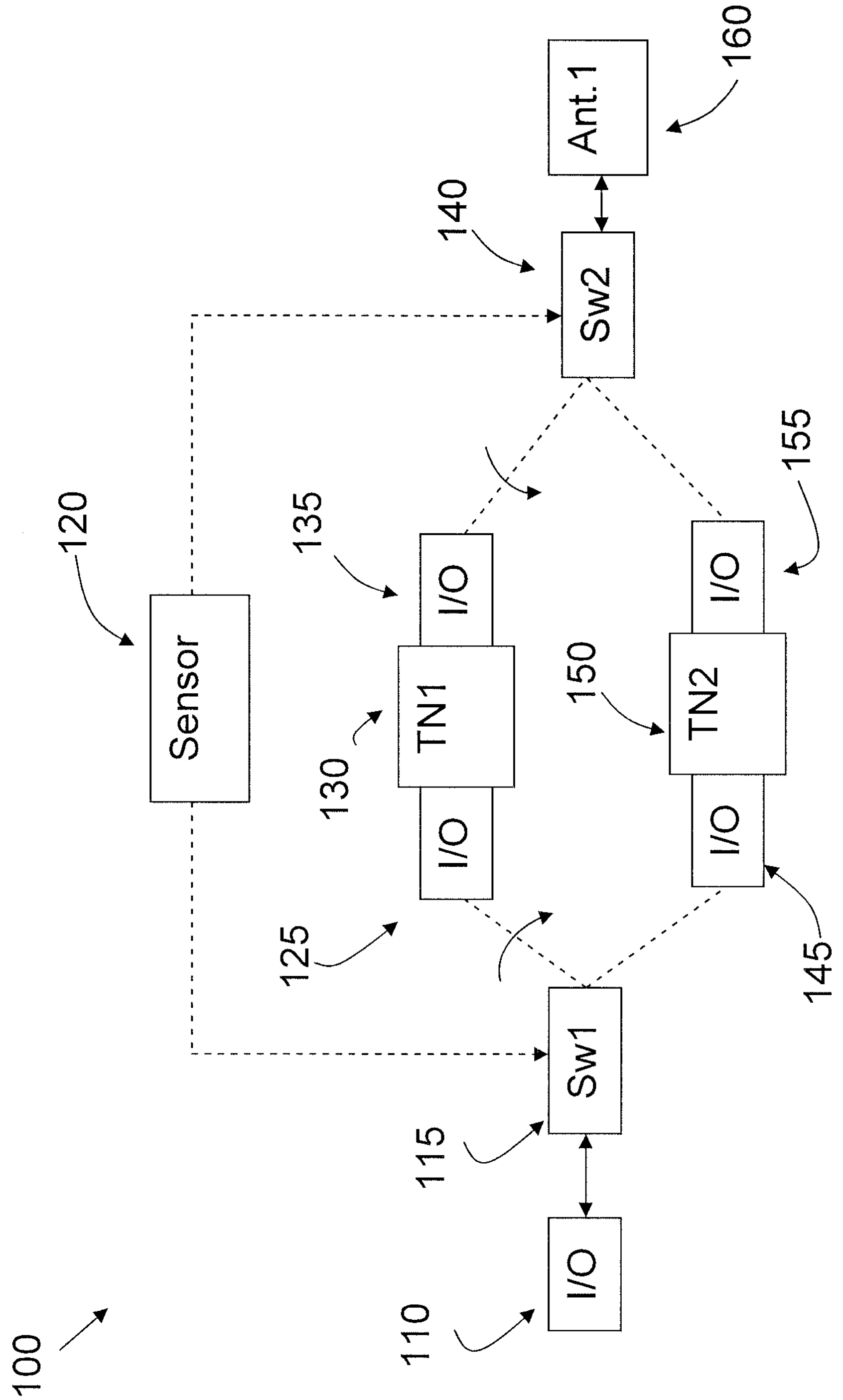
FIGS. 1-5 show different embodiments of the invention.

FIG. 1 shows a first embodiment of an arrangement 100 of the invention. As is indicated, the arrangement 100 comprises a first input/output connection 110, as well as comprising at least a first 130 and a second 150 tuning network. Suitably but not necessarily, the two tuning networks 130, 150, have different transfer functions.

The arrangement 100 also comprises a first antenna 160, which may be used for the transmission and/or reception of electromagnetic signals to and/or from a device which has been connected to the arrangement via the input/output 110.

As is indicated in FIG. 1, each of the tuning networks 130, 150, also comprises a first and a second input/output port, 125,145/135,155. In addition, the arrangement 100 comprises a first switch 115, which may connect the input/output connection 110 of the arrangement to one of the tuning networks 130, 150, via the inputs/outputs 125, 145 of the tuning networks.

In addition, the arrangement comprises a second switch 140, which may be used to connect the antenna 160 of the arrangement to the second input/output port of one the tuning networks 130, 150, so that an external device which has been connected to the arrangement 100 via the input/output 110 may be connected to the antenna 160 via one of the tuning networks 130, 150. The switches can be of any suitable type, such as pin-diode switches or electromechanical switches, including MEMS (micro electro mechanical system) switches.

As has been mentioned previously in this text, one of the goals of the present invention is to obtain an antenna or antenna arrangement which has a higher degree of tuneability than previous such antennas/arrangements, the tuneability being with respect to a form factor of the antenna arrangement or a device in which the antenna arrangement is installed.

In order to achieve this, the device 100 is provided with a sensor 120 for sensing at least a first form factor of the antenna arrangement or a device in which the antenna arrangement is installed. The form factor(s) can be of a wide variety, but mention can especially be made of such form factors as the angle of a movable or rotatable part of a foldable device, e.g. clam shell cellular phones or laptop computers, or devices which have retractable parts, as is the case with some PDAs (Personal Digital Assistants) and certain kinds of cellular phones.

In the cases enumerated above, i.e. foldable/retractable devices, the sensor 120 will thus be able to sense one of a number of angles/positions, or can be continuous, i.e. it senses the present angle/position of the device, instead of sensing one of a number of pre-programmed angles/positions of the device. Such angle/position sensors can be designed according to a number of principles, which are known as such, and the sensor will thus not be described in more detail here. However, if the form factor which is to be sensed is the position of a movable/retractable/rotatable part of a device, examples of sensors are:

Mechanical sensors, such as spring loaded plungers
Magnetic sensors,
Optical sensors.

However, the form factor which is sensed by the sensor may be one of a large number of form factors, especially if the term "form factor" is interpreted in the broad sense in which it is used by the present disclosure. For example, the sensor could sense the SWR, the Standing Wave Ratio, of the transmitted signal, or it could sense the impedance of the arrangement or the device in which the arrangement is used, since the impedance may change if the arrangement or device is touched by or is proximate to an external body, such as that of, for example, a human user, and the impedance change may depend on the force with which the device/arrangement is touched as well as on which parts of the device/arrangement that is exposed to the external body and the location of the external body relative to the device/arrangement.

Thus, the sensor 120 will output a signal which depends on one or more form factors. This signal is used as input to the first and second switches 115, 140 of the antenna arrangement 100, which is also indicated in FIG. 1. Consequently, the switches 115, 140, may use the input from the sensor 120 in order to connect the input 110 of the arrangement to one of the tuning networks 130, 150, and to connect the tuning network to which the input is connected to the antenna 160 of the arrangement. Thus, a device which has been connected to the arrangement via the input/output connection 110 may be connected to the antenna 160 via the tuning network 130, 150 which is optimal for the present form factor, as sensed by the sensor 120.

As mentioned previously, the first 130 and the second tuning networks 150 preferably have different transfer functions. The transfer functions may differ for example due to different impedances of the tuning networks. Thus, in the example with different impedances, a device which has been connected to the arrangement 100 will be connected to the antenna 160 via a tuning network which has an impedance which is suitable for the in situ antenna impedance caused by the present form factor of the arrangement 100. In the case of laptop computers for example, the in situ antenna impedance will vary with the angle between the foldable lid and the body of the computer.

Figure 2:
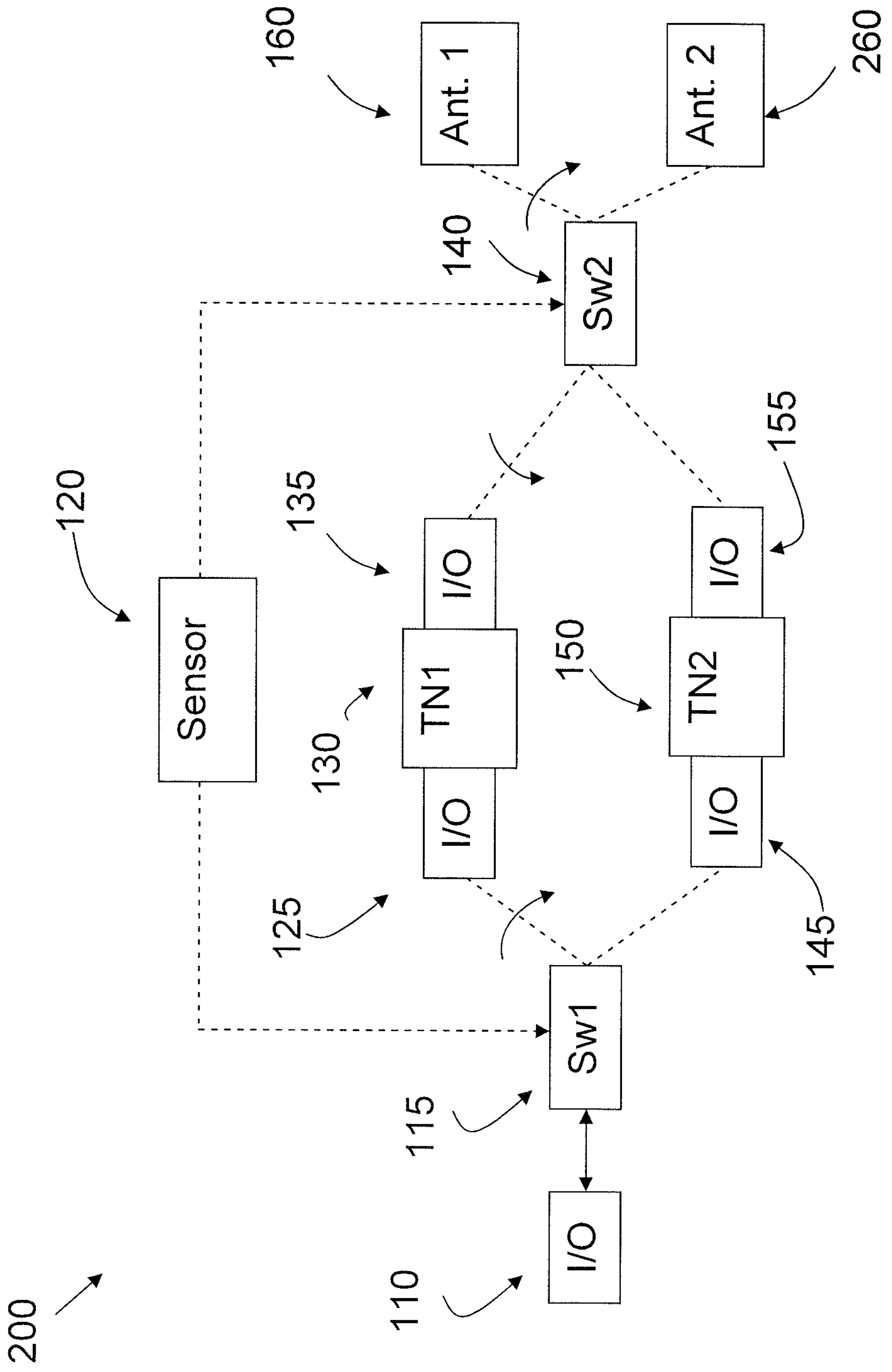

FIG. 2 shows a second embodiment 200 of the arrangement of the invention. Components which are similar to those of the embodiment 100 shown in FIG. 1 have retained their reference numerals in FIG. 2. As can be seen from FIG. 2, a major difference between the embodiment 200 and the embodiment 100 of FIG. 1 is that the embodiment 200 comprises a second antenna 260, and that the second switch 140 may be used to connect the output of one of the tuning networks to one of the two antennas. Thus, an external device which has been connected to the arrangement 100 may be connected to an antenna 160, 260 which is optimal for the current form factor sensed by the sensor 120 via a tuning network which is optimal for the current form factor.

Figure 3:
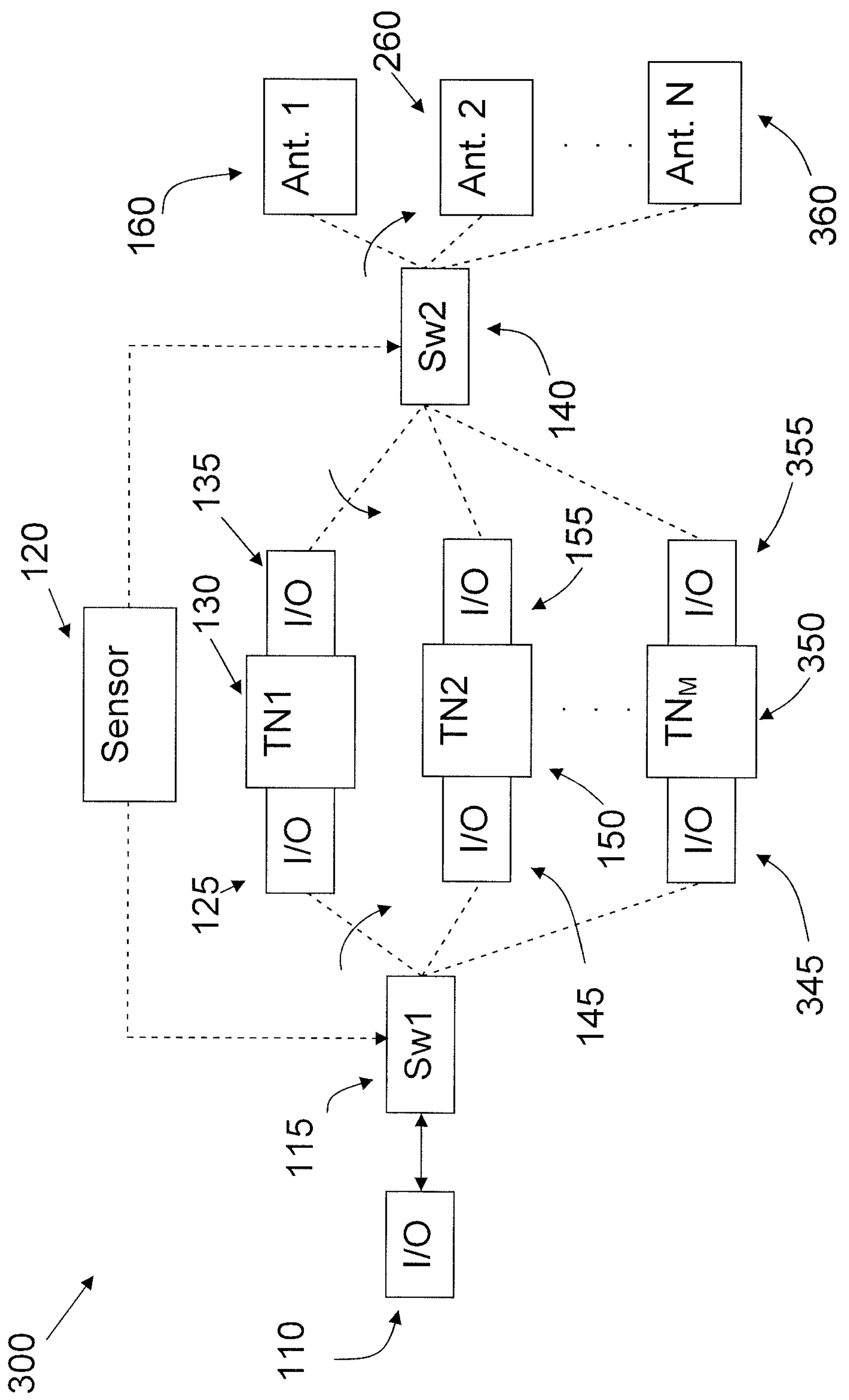

A third embodiment 300 of the invention is shown in FIG. 3. This embodiment is a more general form of the embodiments shown in FIGS. 1 and 2, and comprises M tuning networks and N antennas, where $N \geqq 2$ and $M \geqq N$. Thus, by means of the first 115 and second 140 switches, an external device which has been connected to the arrangement 300 may be connected to an antenna 160, 260, 360 which is optimal for the current form factor sensed by the sensor 120 via a tuning network 130, 150, 350 which is optimal for the current form factor, where the embodiment 300 offers a larger number of antennas and tuning networks than available in the embodiments 100 and 200.

Figure 4:
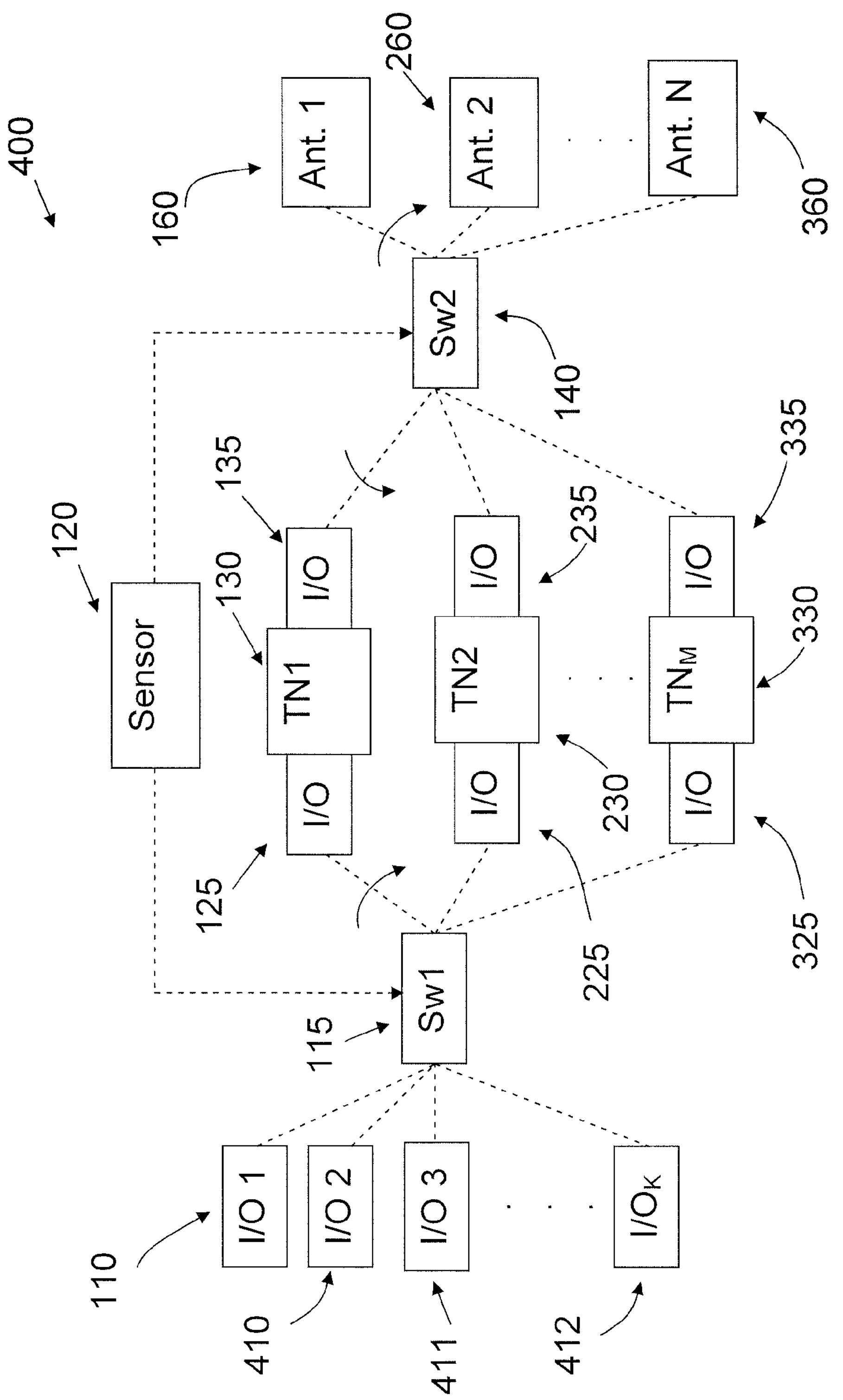

FIG. 4 shows a fourth embodiment 400 of the invention. This embodiment is similar to the one shown in FIG. 3, but has a plurality K of input/output connections, where K≧2. The general function of the arrangement 400 is the same as the one of the arrangement 300 of FIG. 3, with the difference, however, that the first 115 and second switch 140 may be used to connect an input 1-K to an antenna 1-N via a tuning network 1-M in a way which is optimal for the current form factor of the arrangement 400 as sensed by the sensor 120.

Figure 5:
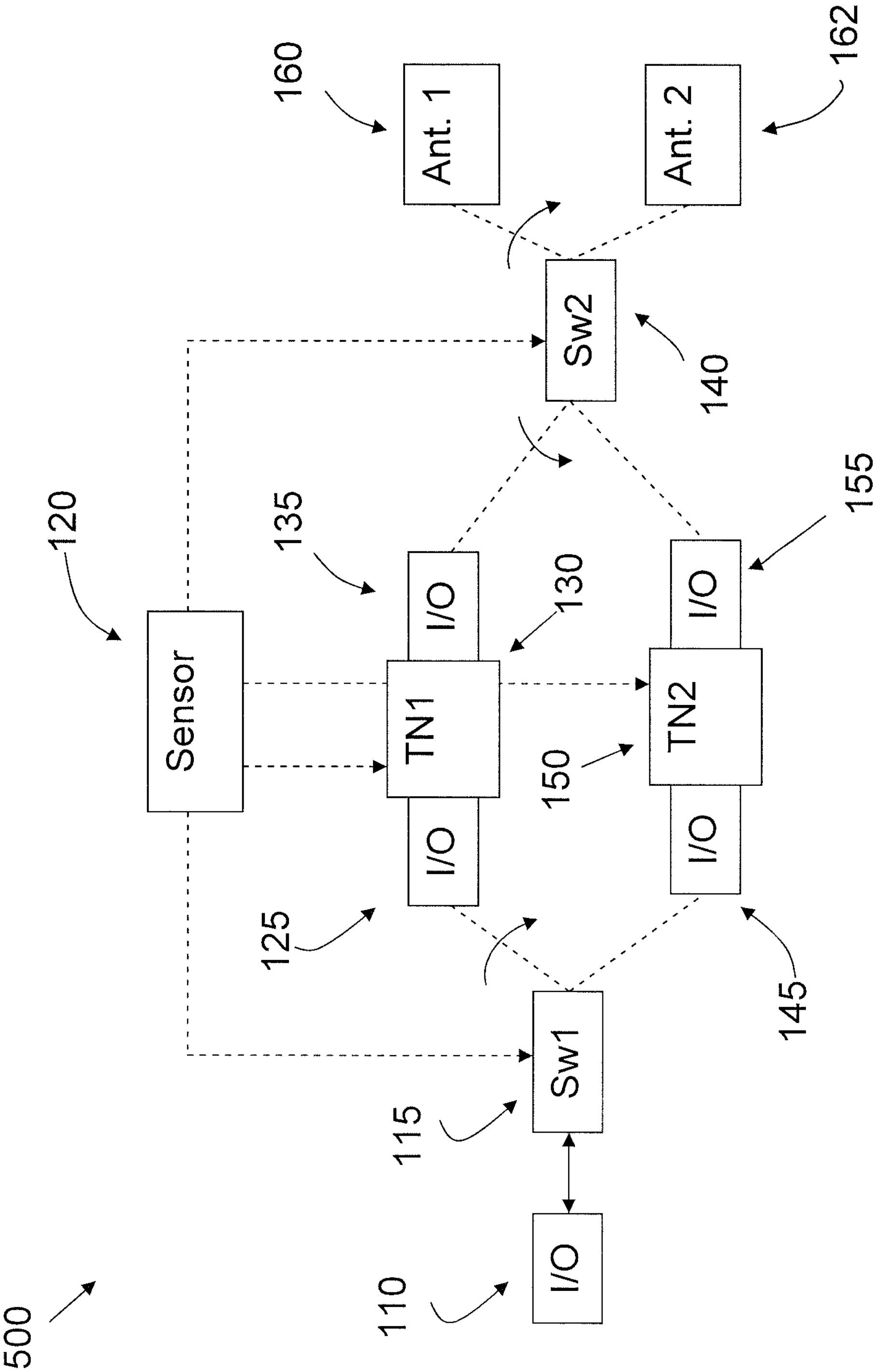

Finally, FIG. 5 shows an embodiment 500 of the invention. This embodiment 500 comprises a feature which may be used in any of the other embodiments described in this disclosure: the output of the sensor 120 may also be used for influencing at least one of the tuning networks comprised in the arrangement, so that the tuning network is adapted to a form factor of the arrangement or of an apparatus in which the arrangement is used, as sensed by the sensor 120.

As an example, in the case where the transfer functions of the tuning networks differ due to different impedances, it could be conceivable to have at least one tuning network with variable impedance, which could be varied according to the input from the sensor 120. Thus, in one possible embodiment with variable tuning networks, each network could be varied within a certain impedance range.

Figure 6:
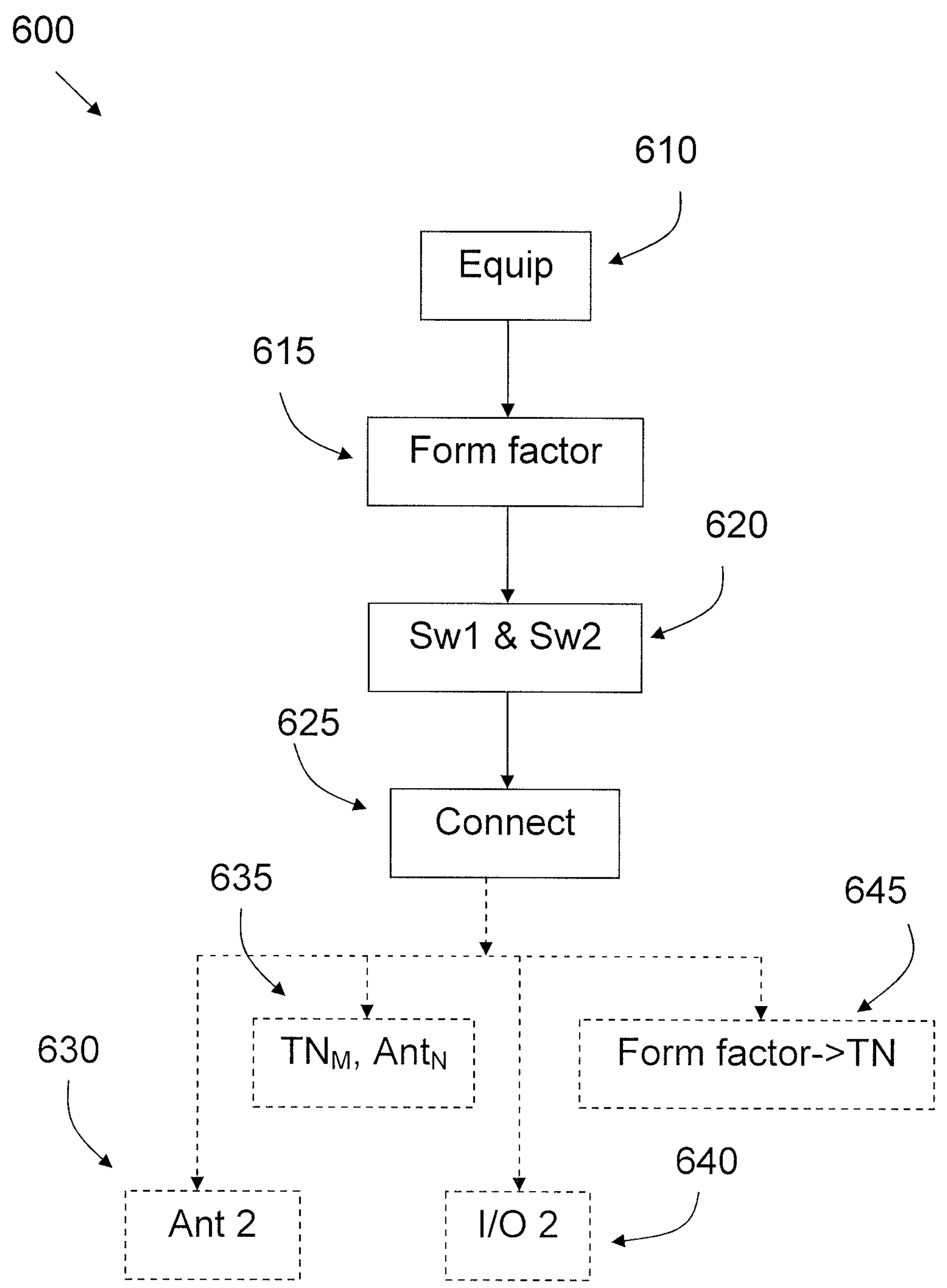
FIG. 6 shows a flow chart of a method of the invention.

FIG. 6 shows a rough flow chart of a method of the invention. Steps which are options or alternatives are shown in dashed lines. Reference numbers of components below are taken from FIGS. 1-5.

Thus, the method 600 of the invention may be used in an antenna arrangement such as those shown in FIGS. 1-5, which are used for the transmission and/or reception of electromagnetic signals. According to the method, as indicated in step 610, the arrangement is equipped with the following:

- a first input/output connection, 110 and,
- at least a first, 130, and a second, 150 tuning network, which tuning networks have different transfer functions,
- each of said tuning network also comprising a first 125, 145, and a second, 135,155, input/output port,
- a first antenna 160,
- a first switch 115 for connecting the first input/output connection of the arrangement to the first input/output port of one of said tuning networks, and
- a second switch 140 for connecting the antenna of the arrangement to the second input/output port of the tuning network to which the input/output connection of the arrangement has been connected.

Step 615 shows that the method comprises the use of a form factor of the arrangement or of an apparatus in which the arrangement is used for influencing, step 620, said first, 115, and second, 140, switches, so that a device which has been connected to the arrangement may be connected, step 625, to the antenna via a tuning network which is optimal for the current form factor of the arrangement.

As indicated in step 630, the method may additionally comprise the use of a second antenna 260 in the arrangement, and also using said second switch 140 for connecting one of the antennas, 160, 260, of the arrangement to the second input/output port of the tuning network to which the input/output connection of the arrangement has been connected, so that a device which has been connected to the arrangement may be connected to an antenna which is optimal for the current form factor of the arrangement via a tuning network which is optimal for the current form factor of the arrangement.

Step 635 indicates that the method of the invention may additionally comprise the use in the arrangement of M tuning arrangements, M>2, and N antennas, N>2, with M≧N, and letting the first and second switches of the arrangement be used to connect a device which has been connected to the arrangement to an antenna which is optimal for the current form factor of the arrangement via a tuning network which is optimal for the current form factor of the arrangement.

As shown in step 640, the method may comprise the use of at least a second input/output connection to the arrangement, and the use of the first switch 115 for connecting one of the input connections of the arrangement to one of the tuning networks.

According to the inventive method, the first switch may be used to connect one of the input connections of the arrangement to one of said tuning networks based on said form factor.

As shown in step 645, the method 600 may comprise the use of the form factor for influencing at least one of the tuning networks, so that said at least one tuning network is adapted to a form factor of the arrangement or of an apparatus in which the arrangement is used.

The invention is not limited to the examples of embodiments described above and shown in the drawings, but may be freely varied within the scope of the appended claims. It should be noted, for example, that the multiple antennas employed in an antenna arrangement of the invention do not need to be physically separate antennas, but may be separate antenna functions in one and the same physical unit. The same is true for the multiple tuning networks used in an antenna arrangement of the invention, i.e. they do not need to be physically separate tuning networks, but may be separate tuning network functions in one and the same physical unit.

Also, the tuning networks may be tuneable with respect to one or more factors other than impedance. For example, tuning networks for use in the invention could have different and tuneable filter functions.

Also, the sensor used in the invention may gauge and provide multiple simultaneous form factor values, which may be used individually to control switches and tuning networks or may be combined to provide one or more derived form factor values for controlling switches and tuning networks.

The invention claimed is:

1. An antenna arrangement for transmission and/or reception of electromagnetic signal's, the arrangement comprising a first input/output connection and at least first and second tuning networks, the first and second tuning networks have different transfer functions, each of the first and second tuning networks also comprising first and second input/output ports, the arrangement additionally comprising a first antenna and a first switch for connecting the first input/output connection of the arrangement to the first input/output port of one of the first and second tuning networks, with a second switch for connecting the first antenna of the arrangement to the second input/output port of the first and second tuning networks, the arrangement also comprising a sensor for sensing a form factor of the arrangement or of an apparatus in which the arrangement is used, and in that the sensor can be used for influencing the first and second switches, and at least one of the first and second tuning networks, so that a device which has been connected to the arrangement may be connected to the first antenna via one of the first and second tuning networks which is optimal for the form factor of the arrangement, and the one of the first and second tuning networks is adapted to the form factor of the arrangement.

2. The arrangement of claim 1, additionally comprising a second antenna, in which the second switch can also be used for connecting one of the first and second antennas of the arrangement to the second input/output port of the first and second tuning networks, so that the device which has been connected to the arrangement may be connected to one of the first and second antennas via one of the first and second tuning networks which is optimal for the form factor of the arrangement.

3. The arrangement of claim 1, additionally comprising M tuning networks, M>2, and also comprising N antennas, N>2 and M≧N, in which the first and second switches can be used to connect the device which has been connected to the arrangement to one of the N antennas via one of the M tuning networks which is optimal for the form factor of the arrangement.

4. The arrangement of claim 1, additionally comprising at least a second input/output connection, in which the first switch may also be used to connect one of the first and second input/output connections of the arrangement to one of the first and second tuning networks.

5. The arrangement of claim 4, in which the first switch connects one of the first and second input/output connections of the arrangement to one of the first and second tuning networks based on an output of the sensor for sensing the form factor.

6. An antenna arrangement for transmission and/or reception of electromagnetic signals, the arrangement comprising a first input/output connection, M tuning networks, M>2, and N antennas, N>2 and M≧N, each of the M tuning networks comprising first and second input/output ports, the arrangement additionally comprising a first switch for connecting the first input/output connection of the arrangement to the first input/output port of the M tuning networks, with a second switch for connecting the N antennas to the second input/output port of the M tuning networks, the arrangement also comprising a sensor for sensing a form factor of the arrangement or of an apparatus in which the arrangement is used, and in that the sensor can be used for influencing the first and second switches, so that a device which has been connected to the arrangement may be connected to one of the N antennas via one of the M tuning networks which is optimal for the form factor of the arrangement.

7. The arrangement of claim 6, additionally comprising at least a second input/output connection, in which the first switch may also be used to connect one of the first and second input/output connections of the arrangement to one of the M tuning networks.

8. The arrangement of claim 7, in which the first switch connects one of the first and second input/output connections of the arrangement to one of the M tuning networks based on an output of the sensor for sensing the form factor.

9. The arrangement of claim 6, in which the sensor is also used for influencing at least one of the M tuning networks, so that the at least one of the M tuning networks is adapted to a form factor of the arrangement.

10. A method of using an antenna arrangement for transmission and/or reception of electromagnetic signals, the arrangement comprising a first input/output connection, M tuning networks, M>2, and N antennas, N>2 and M≧N, each of the M tuning networks comprising first and second input/output ports, the method comprising:

connecting the first input/output connection to the first input/output port of the M tuning networks with a first switch of the arrangement connecting the N antennas to the second input/output port of the M tuning networks with a second switch of the arrangement;

sensing a form factor of the arrangement or of an apparatus in which the arrangement is used with a sensor of the arrangement; and influencing the first and second switches with the sensor, so that a device which has been connected to the arrangement may be connected to the one of the N antennas via one of the M tuning networks which is optimal for the form factor of the arrangement.

11. The method of claim 10, wherein the arrangement comprises at least a second input/output connection and the method further comprises connecting one of the first and second input/output connections of the arrangement to one of the M tuning networks with the first switch of the arrangement.

12. The method of claim 11, in which the first switch connects one of the first and second input/output connections of the arrangement to one of the M tuning networks based on an output of the sensor for sensing the form factor.

13. The method of claim 10, further comprising influencing one of the M tuning networks with the sensor, so that the one of the M tuning networks is adapted to a form factor of the arrangement.

* * * * *

UNITED STATES PATENT AND TRADEMARK OFFICE

CERTIFICATE OF CORRECTION

PATENT NO. : 8,457,697 B2
APPLICATION NO. : 12/742898
DATED : June 4, 2013
INVENTOR(S) : Johansson et al.

It is certified that error appears in the above-identified patent and that said Letters Patent is hereby corrected as shown below:

In the Specifications

In Column 4, Line 8, delete “plungers” and insert -- plungers, --, therefor.

In the Claims

In Column 6, Line 49, in Claim 1, delete “signal’s,” and insert -- signals, --, therefor.

In Column 8, Lines 10-11, in Claim 9, delete “to a form” and insert -- to the form --, therefor.

In Column 8, Line 21, in Claim 10, delete “arrangement” and insert -- arrangement; --, therefor.

In Column 8, Line 45, in Claim 13, delete “to a form” and insert -- to the form --, therefor.

Signed and Sealed this
Twenty-eighth Day of January, 2014

Michelle K. Lee
*Deputy Director of the United States Patent and Trademark Office*